United States Patent
Kitayama et al.

(10) Patent No.: US 9,202,672 B2
(45) Date of Patent: Dec. 1, 2015

(54) APPARATUS AND METHOD FOR PROBE SHAPE PROCESSING BY ION BEAM

(75) Inventors: Shinya Kitayama, Hitachinaka (JP); Satoshi Tomimatsu, Hitachinaka (JP); Tsuyoshi Onishi, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 170 days.

(21) Appl. No.: 13/641,211

(22) PCT Filed: Apr. 12, 2011

(86) PCT No.: PCT/JP2011/059044
§ 371 (c)(1),
(2), (4) Date: Oct. 15, 2012

(87) PCT Pub. No.: WO2011/129315
PCT Pub. Date: Oct. 20, 2011

(65) Prior Publication Data
US 2013/0032714 A1 Feb. 7, 2013

(30) Foreign Application Priority Data
Apr. 16, 2010 (JP) ................. 2010-094909

(51) Int. Cl.
*H01J 37/31* (2006.01)
*H01J 37/305* (2006.01)
*H01J 37/304* (2006.01)

(52) U.S. Cl.
CPC ........... *H01J 37/3056* (2013.01); *H01J 37/304* (2013.01); *H01J 2237/208* (2013.01); *H01J 2237/31745* (2013.01)

(58) Field of Classification Search
CPC ....... B82Y 35/00; G01Q 70/16; G01Q 60/40; G02B 21/32; H01J 37/3023; H01J 2237/30466; H01J 37/304; H01J 37/3056; H01J 2237/31745; H01J 2237/31749; H01J 37/20; H01J 2237/208; H01J 2237/3174; H01J 2209/0226; B81B 1/008

USPC ............... 250/492.1, 492.3, 309; 324/754.01; 216/11
See application file for complete search history.

(56) References Cited

U.S. PATENT DOCUMENTS

| | | | |
|---|---|---|---|
| 5,270,552 A | | 12/1993 | Ohnishi |
| 5,367,165 A | * | 11/1994 | Toda et al. ...................... 850/57 |
| 6,420,722 B2 | * | 7/2002 | Moore et al. ................... 850/18 |
| 6,781,125 B2 | * | 8/2004 | Tokuda et al. ................... 850/1 |

(Continued)

FOREIGN PATENT DOCUMENTS

| | | |
|---|---|---|
| JP | 5-52721 | 3/1993 |
| JP | 2000-171364 | 6/2000 |

(Continued)

OTHER PUBLICATIONS

Vasile, M.J.; Grigg, D.; Griffith, J.E.; Fitzgerald, E.; Russell, P.E., "Scanning probe tip geometry optimized for metrology by focused ion beam ion milling," Journal of Vacuum Science & Technology B: Microelectronics and Nanometer Structures, vol. 9, No. 6, pp. 3569,3572, Nov. 1991 doi: 10.1116/1.585846.*

(Continued)

*Primary Examiner* — Brooke Purinton
(74) *Attorney, Agent, or Firm* — Baker Botts L.L.P.

(57) ABSTRACT

There is provided an apparatus and a method capable of preparing a standardized probe without need for working skill of probe processing. According to the present invention, a probe shape generation process of detecting a probe shape based on the probe incoming current detected by a probe current detection unit, a probe tip coordinate extraction process of detecting a tip position of the probe from the probe shape, a probe contour line extraction process of generating a probe contour line obtained by approximating a contour of the probe from the tip position of the probe and the probe shape, a probe center line extraction process of generating a center line and a vertical line of the probe from the probe contour line, a processing pattern generation process of generating a processing pattern based on the probe tip position, the probe center line, the probe vertical line, and a preset shape and dimension of a probe acute part, and an ion beam termination process of performing, based on the processing pattern, termination of ion-beam processing are performed.

12 Claims, 13 Drawing Sheets

(56) References Cited

U.S. PATENT DOCUMENTS

| | | | |
|---|---|---|---|
| 6,930,317 B2* | 8/2005 | Abe | 850/1 |
| 2002/0166976 A1 | 11/2002 | Masakazu | |
| 2004/0135096 A1 | 7/2004 | Fukuda et al. | |
| 2004/0256577 A1* | 12/2004 | Stevens et al. | 250/492.21 |
| 2007/0154354 A1* | 7/2007 | Faris | 422/99 |
| 2008/0289954 A1* | 11/2008 | Kaito | 204/192.34 |
| 2009/0138995 A1* | 5/2009 | Kelly et al. | 850/60 |
| 2010/0320171 A1* | 12/2010 | Mao et al. | 250/492.1 |

FOREIGN PATENT DOCUMENTS

| | | |
|---|---|---|
| JP | 2002-150983 | 5/2002 |
| JP | 2004-340611 | 12/2004 |
| JP | 2005-259353 | 9/2005 |
| JP | 2009-109236 | 5/2009 |
| JP | 2010-177063 | 8/2010 |

OTHER PUBLICATIONS

Extended European Search Report for EP Application No. 11768836.6, dated Nov. 24, 2014.

Langford et al., "In Situ lift-out: Steps to improve yield and a comparison with other FIB TEM sample preparation techniques", Micron, 39(8):1325-1330 (Dec. 1, 2008).

* cited by examiner

APPARATUS AND METHOD FOR PROBE SHAPE PROCESSING BY ION BEAM

RELATED APPLICATIONS

This application is a U.S. national phase under 35 U.S.C. §371 of International Application No. PCT/JP2011/059044 filed Apr. 12, 2011 claiming priority of Japanese Application No. 2010-094909 filed Apr. 16, 2010.

TECHNICAL FIELD

The present invention relates to an ion beam apparatus and an ion-beam processing method having a function of performing processing on a probe using an ion beam.

BACKGROUND ART

A device is proposed for extracting a fine sample from a sample substrate as a sample preparation device facilitating preparation of a fine sample piece used for analysis devices, combining focused ion beam (Focused Ion BEAM: hereinafter abbreviated to as FIB) processing and micromanipulation technology. Such a technique is described in JP Patent Publication (Kokai) No. 5-052721 A (1993). Such a sample preparation device employs a probe in a charged particle device. The sample preparation device separates the fine sample for analysis from the sample substrate due to FIB processing. Moreover, this fine sample for analysis can be held and carried using the probe. The shape of the probe is recognized based on a scanning ion microscopy image (Scanning Ion Microscope: hereinafter referred to as SIM image) due to ion beam scanning and secondary electron detection. Moreover, there is also a technique for recognizing the shape of the probe based on an incoming current image obtained by synchronizing an incoming current of the probe and a scanning signal of a charged particle beam. Such a technique is described in JP Patent Publication (Kokai) No. 2000-171364 A.

CITATION LIST

Patent Literature

Patent Literature 1: JP Patent Publication (Kokai) No. 5-052721 A (1993)
Patent Literature 2: JP Patent Publication (Kokai) No. 2000-171364 A

SUMMARY OF INVENTION

Technical Problem

It is desired for the sample preparation device that a probe tip part always has a thin and sharp shape for extracting the fine sample piece. However, repetition of operations of extracting fine sample pieces for sample preparation causes the probe tip part to get bolder gradually. Therefore, an operator has to perform processing for probe restoration every time for the sample preparation. The processing of the probe requires operator's operations of the charged particle device and probe controlling device. Hence, the probe processing requires high skill of the operator.

The present invention provides an apparatus and a method capable of preparing a standardized probe without need for working skill of probe processing.

Solution to Problem

According to the present invention, a probe shape generation process of detecting a probe shape based on the probe incoming current detected by a probe current detection unit, a probe tip coordinate extraction process of detecting a tip position of the probe from the probe shape, a probe contour line extraction process of generating a probe contour line obtained by approximating a contour of the probe from the tip position of the probe and the probe shape, a probe center line extraction process of generating a center line and a vertical line of the probe from the probe contour line, a processing pattern generation process of generating a processing pattern based on the probe tip position, the probe center line, the probe vertical line, and a preset shape and dimension of a probe acute part, and an ion beam termination process of performing, based on the processing pattern, termination of ion-beam processing are performed.

Advantageous Effects of Invention

According to the present invention, a standardized probe can be prepared without need for working skill of probe processing.

DESCRIPTION OF EMBODIMENTS

Figure 1:
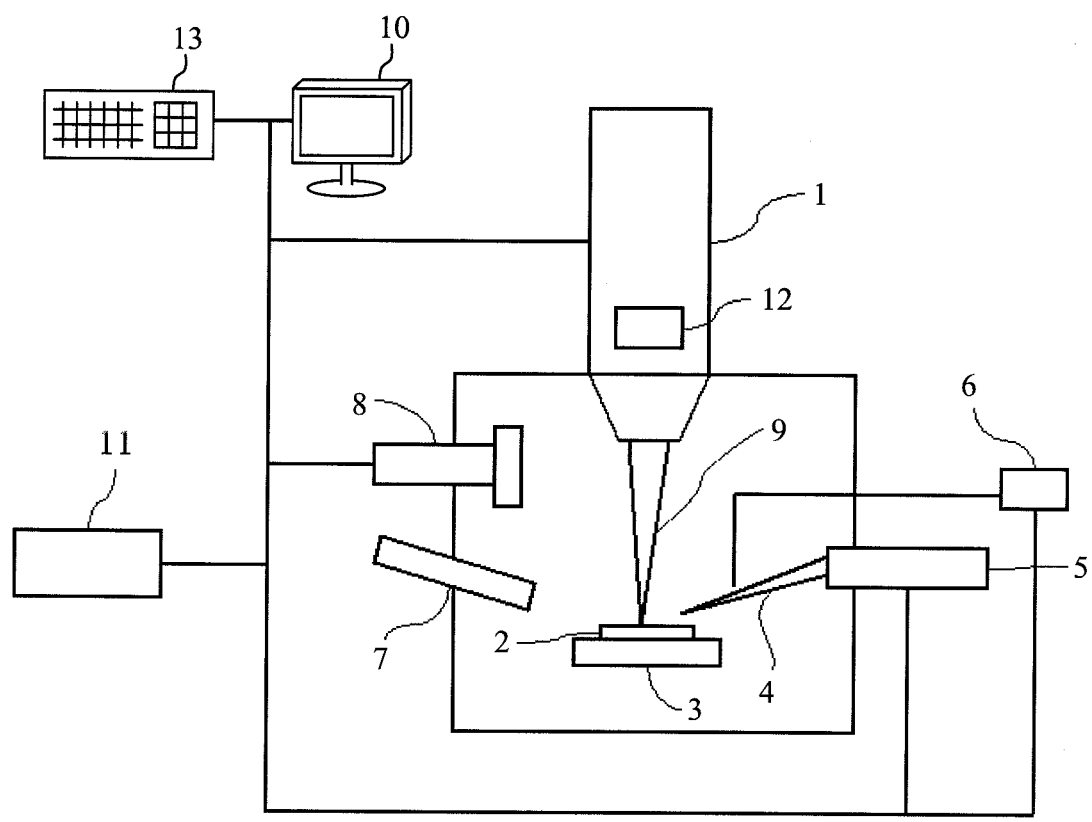
FIG. 1 is an entire schematic configuration diagram of an example of an ion beam apparatus according to the present invention.

FIG. 1 illustrates a basic configuration of an example of an ion beam apparatus according to the present invention. The ion beam apparatus in this example includes an ion beam optical system 1 irradiating a substrate 2 such as a semiconductor wafer and semiconductor chip with an ion beam 9, a movable sample stage 3 on which the substrate 2 is placed, a probe driving unit 5 driving a probe 4 independently from the sample stage 3, a probe current detection unit 6 detecting incoming current of the probe 4, a deposition gas source 7 for supplying gas for ion-beam assisted deposition, a secondary electron detector 8 detecting secondary electrons from the substrate 2, a display unit 10, an input unit 13 and a central processing unit 11. The ion beam optical system 1 includes a deflector 12 scanning the ion beam 9 on the substrate 2. The probe 4 and probe driving unit 5 constitute a manipulator. The central processing unit 11 controls the ion beam optical system 1, sample stage 3, probe 4, probe driving unit 5, deposition gas source 7, display unit 10 and the like.

An image of the substrate 2 is obtained due to a detection signal of secondary electrons detected by the secondary electron detector 8. This image is displayed by the display unit 10. The deposition gas source 7 constitutes fixing connection means for connecting a tip of the probe 4 to a desired position of the substrate 2. A fine sample piece can be extracted from the substrate 2 due to FIB processing using the ion beam optical system 1. The fine sample piece is carried by the probe 4.

According to the present invention, the probe current detection unit 6 amplifies the incoming current of the probe 4, generates a detection signal of the probe incoming current, and sends it to the central processing unit 11. The central processing unit 11 detects a probe shape from the incoming current of the probe 4 to generate a processing pattern based on it. The ion beam optical system 1 performs processing on the tip of the probe based on the processing pattern. According to this example, preferably, the generating of the processing pattern uses an image generated from the incoming current of the probe 4. Thereby, the processing pattern can be generated easily and accurately. However, the generating of the processing pattern may use a scanning ion microscopy image (SIM image).

Figure 2:
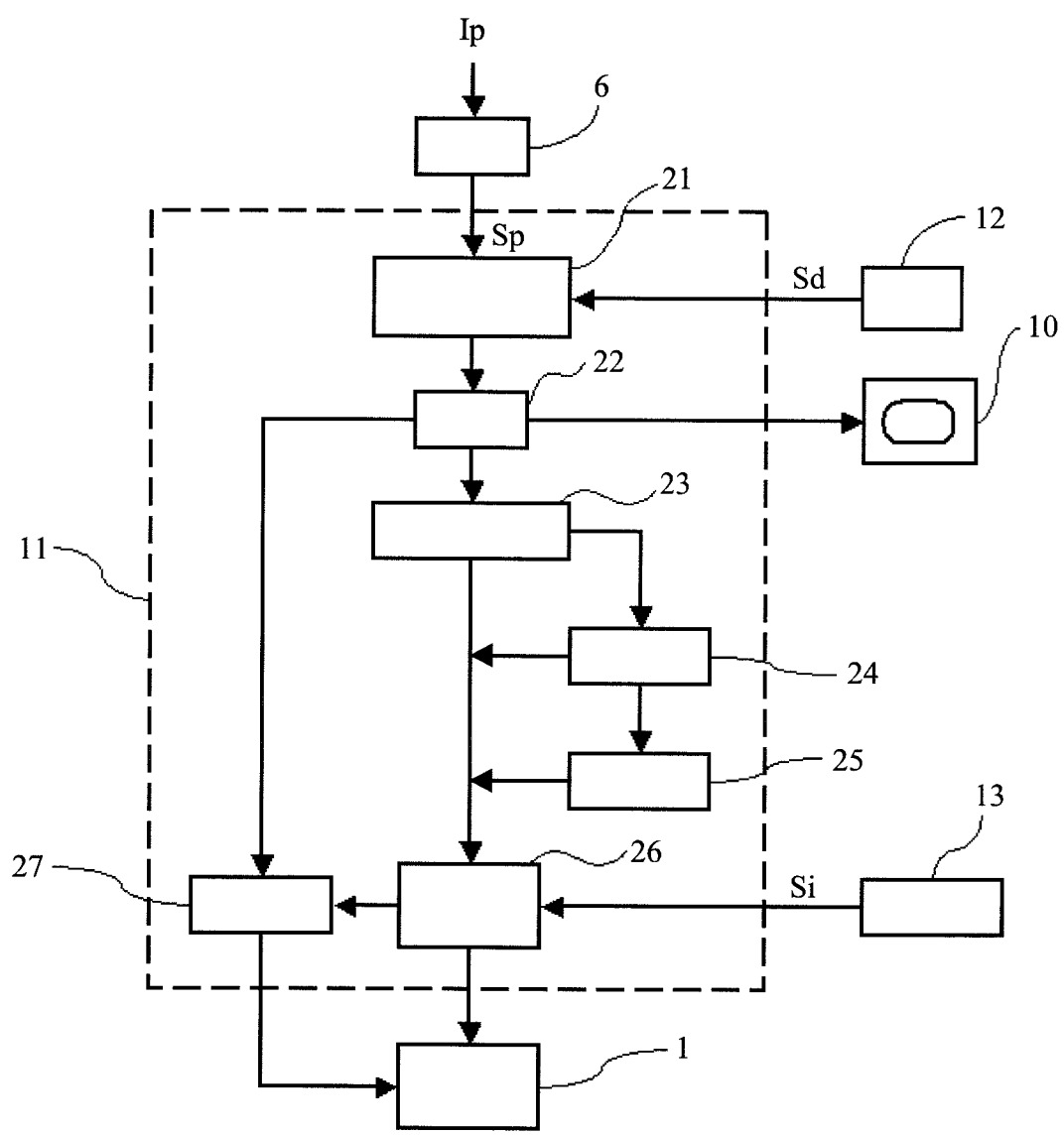
FIG. 2 is a functional block diagram for a probe automatic processing according to the present invention.

With reference to FIG. 2 and FIGS. 3A to 3F, a flow of processes in the ion beam apparatus of the present invention is described. FIG. 2 is a block diagram of the ion beam apparatus, which here includes the probe current detection unit 6, central processing unit 11, deflector 12, display unit 10, input unit 13, central processing unit 11 and ion beam optical system 1. The probe current detection unit 6 detects incoming current (Ip) to the probe 4, amplifies it and generates an image signal (Sp) to supply it to the central processing unit 11. The deflector 12 generates an ion beam scanning signal (Sd) to supply it to the central processing unit 11. The central processing unit 11 performs a probe shape generation process 21, a probe image storing process 22, a probe tip coordinate extraction process 23, a probe contour line extraction process 24, a probe center line extraction process 25, a processing pattern generation process 26 and an ion beam termination process 27. These processes are described below.

In the probe shape generation process 21, a shape of the probe is detected from the image signal (Sp) and ion beam scanning signal (Sd). It is supposed that the tip of the probe is disposed over the upper side of the substrate 2. Scanning the ion beam on the substrate 2 also leads to scanning the ion beam on the probe disposed over the upper side of the substrate 2. During the ion beam scanning on the probe, the detection signal (Sp) of the probe incoming current is not zero. Namely, Sp≠0. During the ion beam, which has passed over the probe, scanning on the substrate, the detection signal (Sp) of the probe incoming current is zero. Namely, Sp=0. Accordingly, by detecting the detection signal (Sp) of the probe incoming current, it can be determined whether the ion beam is scanning on the probe or scanning on the substrate after having passed over the probe. Thus, by connecting points at which there is change from Sp≠0 to Sp=0, a contour of the probe can be drawn. Then, a probe image is obtained as coordinates of an outline of the contour of the probe.

Figure 3A:
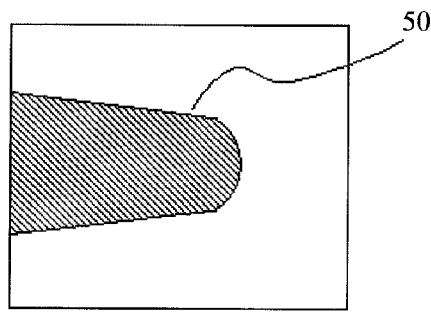
FIG. 3A is an explanatory drawing of a procedure of a first example of the probe automatic processing of the present invention.
Figure 3D:
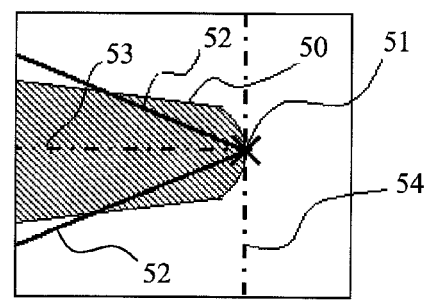
FIG. 3D is an explanatory drawing of a procedure of the first example of the probe automatic processing of the present invention.

Next, in the probe image storing process 22, the probe image obtained in the probe shape generation process 23 is stored in a memory. A probe image 50 stored in the memory is displayed on the display unit 10. FIG. 3A illustrates an example of the probe image 50 obtained due to the probe shape generation process 21. In addition, the probe image 50 can be displayed directly on the display unit 10 without being stored in the memory.

Figure 3B:
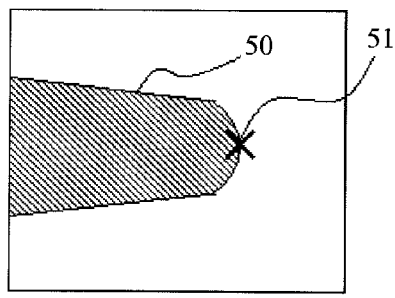
FIG. 3B is an explanatory drawing of a procedure of the first example of the probe automatic processing of the present invention.

In the probe tip coordinate extraction process 23, a position of a probe tip 51 is detected from the probe image 50 and its coordinates are read. The detail of this process is described later. FIG. 3B illustrates a state where the probe tip 51 is detected.

Figure 3E:
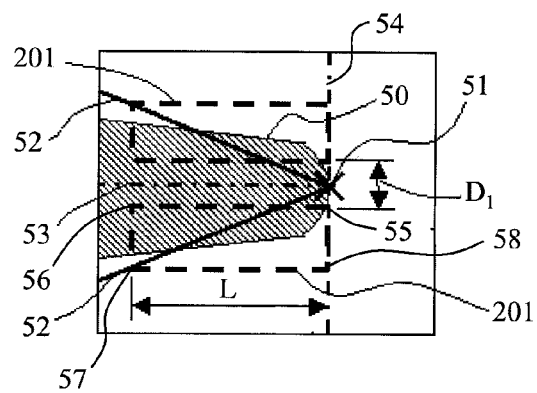
FIG. 3E is an explanatory drawing of a procedure of the first example of the probe automatic processing of the present invention.
Figure 3C:
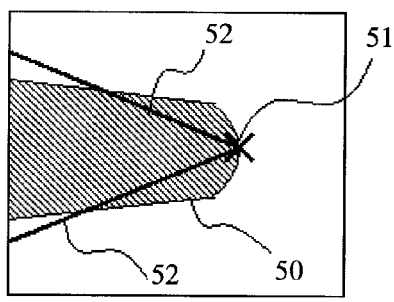
FIG. 3C is an explanatory drawing of a procedure of the first example of the probe automatic processing of the present invention.

In the probe contour line extraction process 24, a contour line 52 of the probe image 50 is detected from the probe image 50 and the position of the probe tip 51. The contour line 52 is a straight line passing through the probe tip and probe base, and is obtained by approximating the outline of the probe image 50. In order to obtain the contour line 52, a least square method may be used, for example. It can be considered that, at first, an equation of the straight line passing through the probe tip is configured and that its inclination is calculated using a least square method. FIG. 3C illustrates two contour lines 52 obtained due to the probe contour line extraction process 24.

In the probe center line extraction process 25, a probe center line 53 and probe vertical line 54 are created from the two contour lines 52. The center line 53 is obtained as a trajectory of middle points between the two contour lines 52. The inclination of the probe center line 53 equals an average of the inclinations of the two probe contour lines 52. Obtaining the center line 53 leads to obtaining the vertical line 54. When the center line 53 inclines, the probe image 50 is rotated such that the center line 53 is oriented in the horizontal direction or in the vertical direction.

Figure 3F:
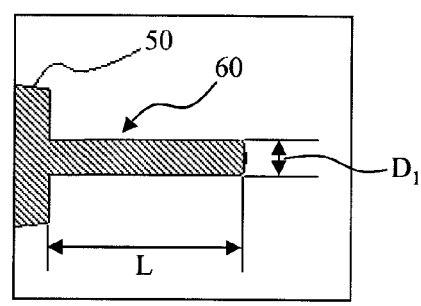
FIG. 3F is an explanatory drawing of a procedure of the first example of the probe automatic processing of the present invention.

In the processing pattern generation process 26, the processing pattern is generated. The processing pattern indicates a region which is irradiated with the ion beam and within which the probe, thereby, is removed. In this example, it is supposed that the processing pattern is a rectangle. The central processing unit 11 obtains the shape and position of a processing pattern 201 based on the coordinates of the probe tip 51 obtained due to the probe tip coordinate extraction process 23, the two probe contour lines 52 obtained due to the probe contour line extraction process 24, the probe center line 53 and vertical line 54 obtained due to the probe center line extraction process 25, and further probe shape input information Si inputted via the input unit 13. The probe shape input information Si includes a preset width $D_1$ and length L of a probe acute part as illustrated in FIG. 3E and FIG. 3F. The probe shape input information Si may be inputted by an operator via the input unit 13, whereas it may be stored in the memory beforehand and read out.

The processing pattern of this example is a rectangle. A procedure of obtaining four vertices 55, 56, 57 and 58 of the rectangle is described below. As illustrated in FIG. 3E, a point with a distance $D_1/2$, which is one half of the width $D_1$ of the probe acute part, from the probe tip 51 is obtained on the vertical line 54, and is set to the first vertex 55. Next, a line which passes through the first vertex 55 and is parallel to the center line 53 is drawn, and a point with a distance which corresponds to the length L of the probe acute part from the probe tip 51 is set to the second vertex 56. A line which passes through the second vertex 56 and is parallel to the vertical line 54 is drawn, and its intersection with the probe contour line 52 is set to the third vertex 57. A point at which a line passing through the third vertex 57 and being parallel to the center line 53 intersects with the vertical line 54 is set to the fourth vertex 58. The rectangle obtained by connecting the four vertices 55, 56, 57 and 58 is the processing pattern 201. The inner long side of the rectangle representing the processing pattern 201 represents the contour of the probe acute part and is parallel to the probe center line 53. In addition, the processing pattern 201 is configured on each of the both sides of the probe image.

The ion beam optical system 1 performs FIB processing based on the processing pattern configured by the central processing unit 11. FIG. 3F illustrates an example of a probe acute part 60 obtained due to the FIB processing. Removal of the region of the processing pattern due to the FIB processing affords the probe acute part 60 having a preset width D, and length L. The tip of the probe is conical. Accordingly, the removal of the region of the processing pattern due to the FIB processing gives the cross section of the probe acute part a long and narrow shape. Then, the probe is allowed to undergo a processing pattern generation rerun process. For example, the probe is allowed to be rotated by 90 degrees and undergo the FIB processing similarly. Thereby, the cross section of the probe acute part is made square.

The central processing unit 11, next, performs the ion beam termination process 27. According to this example, the ion beam termination process 27 includes three cases. With reference to FIG. 4, FIGS. 5A to 5B and FIGS. 6A to 6D, the ion beam termination process 27 is described below.

Figure 4:
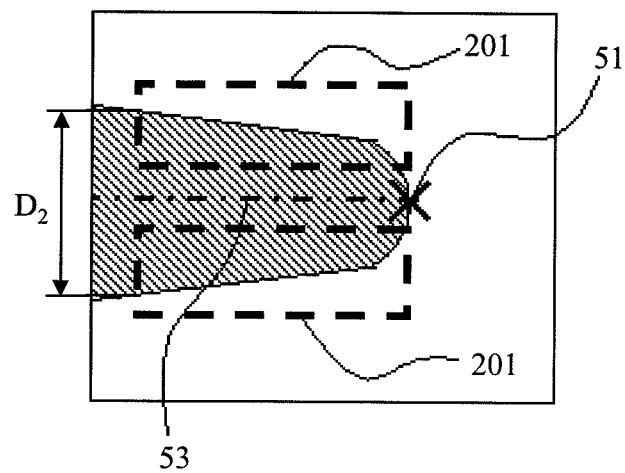
FIG. 4 is an explanatory drawing of a first example of an ion beam termination process of the first example of the probe automatic processing of the present invention.

With reference to FIG. 4, a first case of the ion beam termination process is described. In this example, a time required for FIB processing is predicted from the probe image and processing pattern, and an ion-beam irradiation time is set. Upon elapse of the set ion-beam irradiation time from initiation of ion-beam irradiation, the ion-beam irradiation is terminated automatically. The probe has a conical shape. Therefore, the width of the probe and the thickness of the probe are approximately identical. The ion-beam irradiation time is set based on the width $D_2$ of the base of the probe. For example, when the width $D_2$ of the base of the probe is large the ion-beam irradiation time becomes long, and when the width $D_2$ of the base of the probe is small the ion-beam irradiation time becomes short.

Figure 5A:
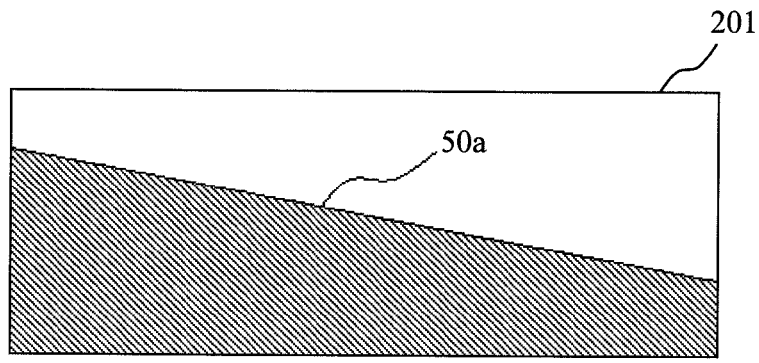
FIG. 5A is an explanatory drawing of a second example of the ion beam termination process of the first example of the probe automatic processing of the present invention.
Figure 5B:
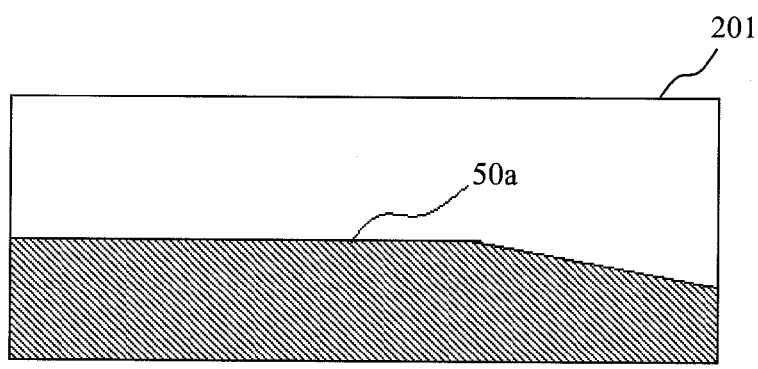
FIG. 5B is an explanatory drawing of the second example of the ion beam termination process of the first example of the probe automatic processing of the present invention.
Figure 5C:
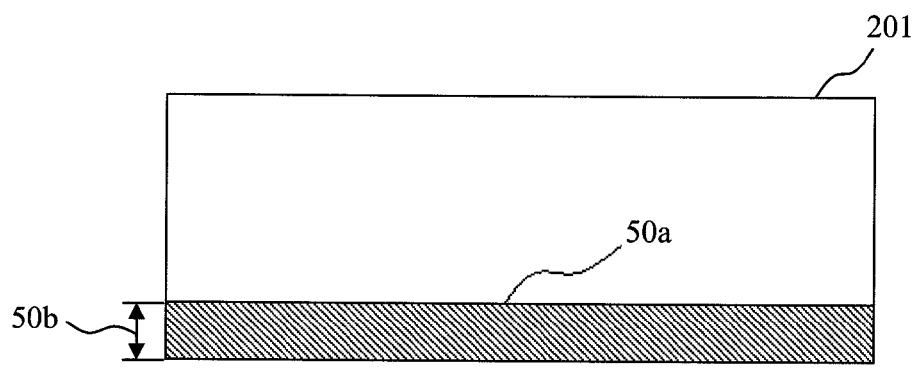
FIG. 5C is an explanatory drawing of the second example of the ion beam termination process of the first example of the probe automatic processing of the present invention.

With reference to FIG. 5A, FIG. 5B and FIG. 5C, a second case of the ion beam termination process is described. In this example, the probe image in processing is being monitored, the probe image is being compared with the processing pattern, and when a difference between the inner long side of the rectangle representing the processing pattern and the contour of the probe image becomes smaller than a predetermined value, the ion-beam irradiation is terminated automatically. FIG. 5A illustrates a contour 50a of the probe image 50 within the processing pattern 201 before initiation of processing. Before initiation of processing, the contour 50a of the probe image 50 inclines. FIG. 5B illustrates a state of deformation of the contour 50a of the probe image due to FIB processing. The FIB processing gives the contour 50a of the probe image smaller inclination and straightness. FIG. 5C illustrates a state of change of the contour 50a for which the probe image becomes smaller due to the FIB processing. As the processing proceeds, a difference 50b between the inner long side of the rectangle representing the processing pattern 201 and the contour 50a of the probe image becomes smaller. When the difference 50b between the inner long side of the rectangle representing the processing pattern 201 and the contour 50a of the probe image becomes smaller than a predetermined value, the ion-beam irradiation is terminated.

In this example, since the FIB processing is performed while monitoring the probe image, the portion of the processing pattern can be removed in high accuracy. However, in this example, the shape and position of the processing pattern 201 is fixed. Therefore, as illustrated in FIG. 5C, as the probe image becomes smaller, a space other than the probe image in the processing pattern 201 becomes larger. In the FIB processing, the range of the processing pattern is irradiated with the ion beam. Namely, within the processing pattern, the irradiation with the ion beam is performed regardless of the presence or absence of the probe. Accordingly, for the region where the probe is absent, the irradiation with the ion beam is wasteful. Hence, in the next example, the processing pattern is being changed.

With reference to FIG. 6A to FIG. 6D, a third case of the ion beam termination process is described. In this example, the probe image in processing is being monitored, and when the probe image is changed, according to this, the processing pattern is changed. As the FIB processing proceeds, the dimensions of the processing pattern, especially, the width become smaller. When the width of the processing pattern becomes smaller than a predetermined value, the ion-beam irradiation is terminated automatically.

Figure 6A:
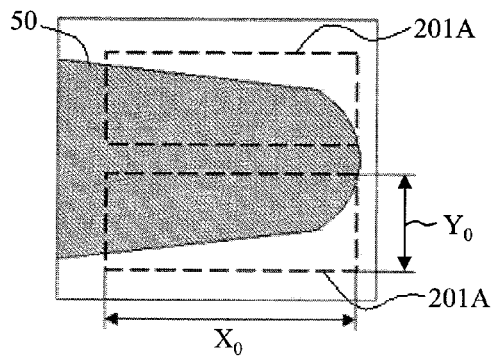
FIG. 6A is an explanatory drawing of a third example of the ion beam termination process of the first example of the probe automatic processing of the present invention.
Figure 6B:
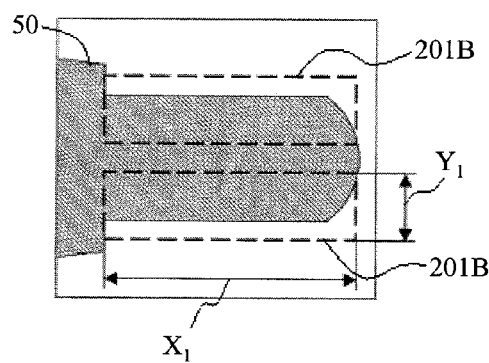
FIG. 6B is an explanatory drawing of the third example of the ion beam termination process of the first example of the probe automatic processing of the present invention.
Figure 6C:
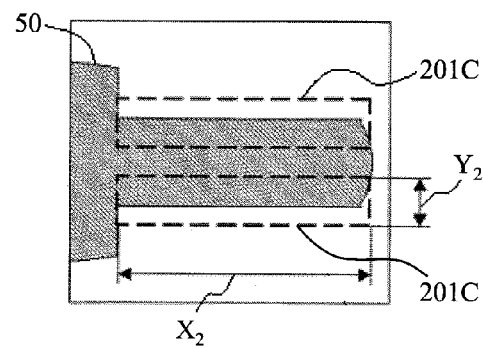
FIG. 6C is an explanatory drawing of the third example of the ion beam termination process of the first example of the probe automatic processing of the present invention.
Figure 6D:
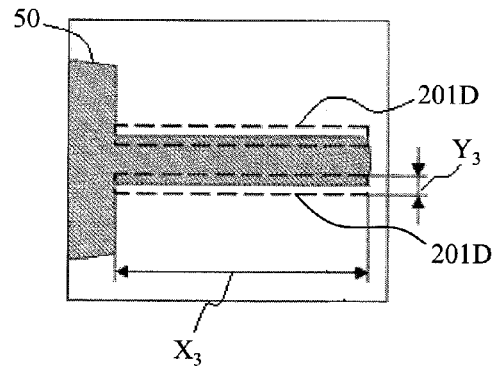
FIG. 6D is an explanatory drawing of the third example of the ion beam termination process of the first example of the probe automatic processing of the present invention.

FIG. 6A illustrates a processing pattern 201A before processing. It is supposed that the horizontal dimension of the processing pattern 201A is $X_0$ and that the vertical dimension is $Y_0$. FIG. 6B illustrates a processing pattern 201B after initiation of the processing. The probe image 50 becomes smaller, and further, its contour becomes flatter. It is supposed that the horizontal dimension of the processing pattern 201B is $X_1$ and that the vertical dimension is $Y_1$. The horizontal dimension $X_1$ of the processing pattern 201B is not changed, but the vertical dimension $Y_1$ becomes smaller. FIG. 6C illustrates a processing pattern 201C in the state where the processing further proceeds. The probe image 50 becomes further smaller. It is supposed that the horizontal dimension of the processing pattern 201C is $X_2$ and that the vertical dimension is $Y_2$. The horizontal dimension $X_2$ of the processing pattern 201C is not changed, but the vertical dimension $Y_2$ becomes further smaller. FIG. 6D illustrates a processing pattern 201D in the state where the processing further proceeds. The probe image 50 becomes further smaller. It is supposed that the horizontal dimension of the processing pattern 201D is $X_3$ and that the vertical dimension is $Y_3$. The horizontal dimension $X_3$ of the processing pattern 201D is not changed, but the vertical dimension $Y_3$ becomes significantly smaller. Then, when the vertical dimension $Y_3$ of the processing pattern 201D becomes smaller than a predetermined value, the ion-beam irradiation is terminated automatically.

In this example, when the probe image 50 becomes smaller as the processing proceeds, according to this, the vertical dimension Y of the processing pattern is made smaller. A generation method of the processing pattern is similar to the method which is described with reference to FIG. 3A to FIG. 3F. In this method, the position of the inner long side out of two long sides of the processing pattern is fixed and the position of the outer long side is changed.

Figure 7:
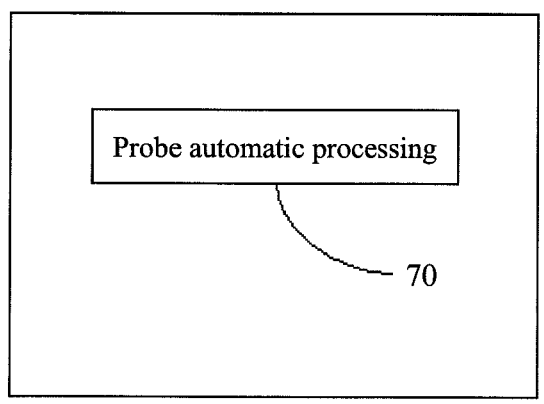
FIG. 7 is a diagram illustrating one example of content within part of a screen display in a display unit of the ion beam apparatus according to the present invention.

FIG. 7 illustrates an example of a screen displayed on the display unit 10. As illustrated in the figure, upon a click on a probe processing start button 70 in the screen, probe automatic processing according to the present invention is initiated.

Figure 8:
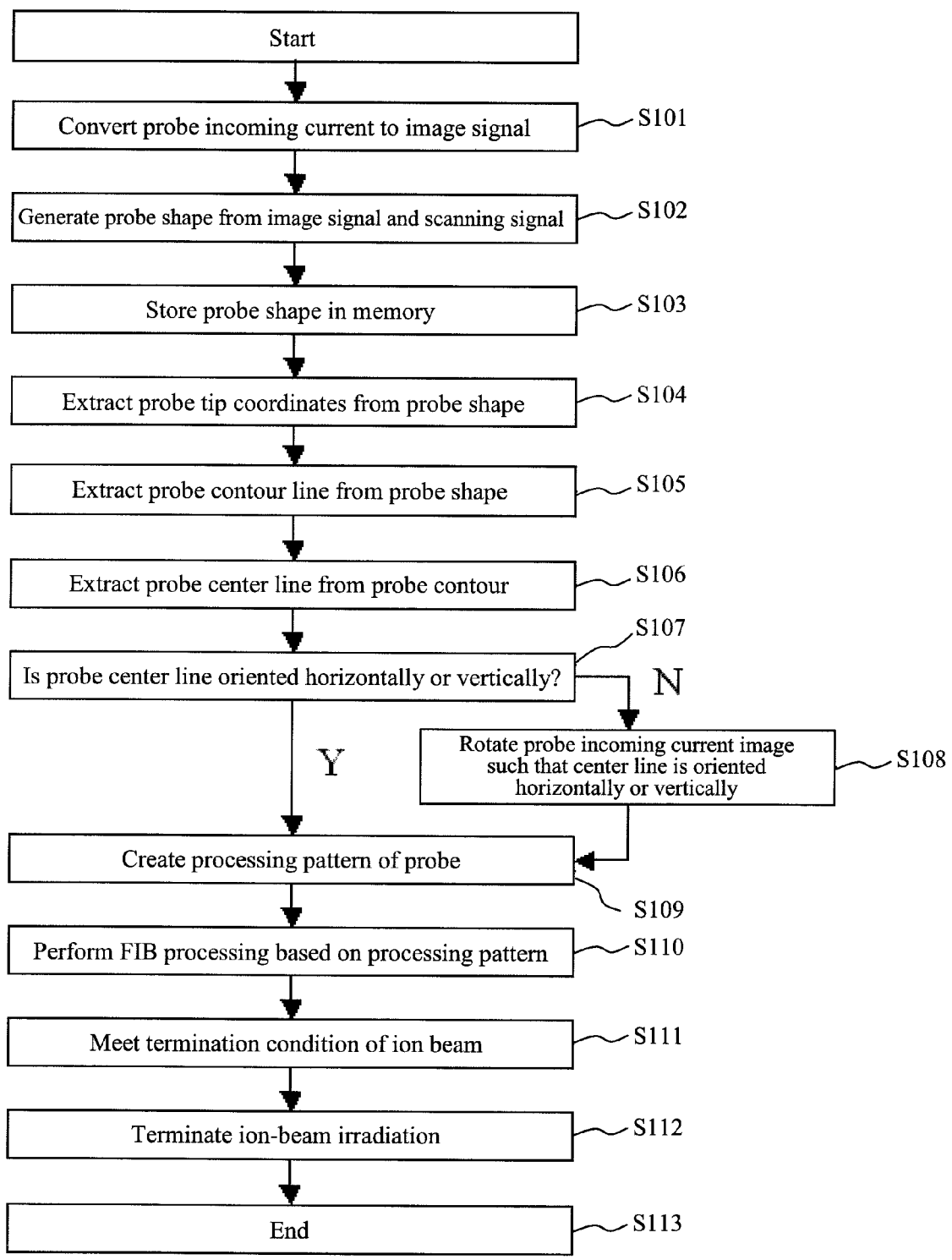
FIG. 8 is a flowchart diagram illustrating a flow of processes in the probe automatic processing according to the present invention.

With reference to FIG. 8, processes of the probe automatic processing according to the present invention are described. In step S101, the incoming current of the probe is converted to the image signal. In step S102, the probe shape generation process 21 is performed. Namely, probe shape information is generated from the image signal and scanning signal. In step S103, the probe image storing process 22 is performed. Namely, the probe shape information is stored in the memory. In step S104, the probe tip coordinate extraction process 23 is performed. Namely, the coordinates of the probe tip are extracted from the probe shape information. In step S105, the probe contour line extraction process 24 is performed. Namely, the straight line which passes through the probe tip and is obtained by approximating the outline of the contour of the probe is extracted. In step S106, the probe center line extraction process 25 is performed. The center line and vertical line of the probe are extracted from the probe contour line. In step S107, it is confirmed whether the probe center line is oriented horizontally or vertically. When the probe center line is oriented horizontally or vertically, the process proceeds to step S109. When the probe center line is not oriented horizontally or vertically, the process proceeds to step S108, where the probe shape information is rotated such that the probe center line is oriented horizontally or vertically. In step S109, the processing pattern generation process 26 is performed. In step S110, the FIB processing is performed on the probe based on the processing pattern. In step S111, it is decided whether or not the ion-beam irradiation is terminated. In this example as mentioned above, there are the three cases. When it is decided that the ion-beam irradiation is to be terminated, the process proceeds to step S112, where the ion beam termination process is performed.

Software may be allowed by the central processing unit 11 to perform the probe automatic processing of this example.

As above, the ion beam apparatus of this example performs the probe shape generation process 21, probe image storing process 22, probe tip coordinate extraction process 23, probe contour line extraction process 24, probe center line extraction process 25, processing pattern generation process 26 and ion beam termination process 27 automatically. According to this example, a standardized probe can be prepared readily, speedily and reliably without need for high working skill of an operator.

Figure 9A:
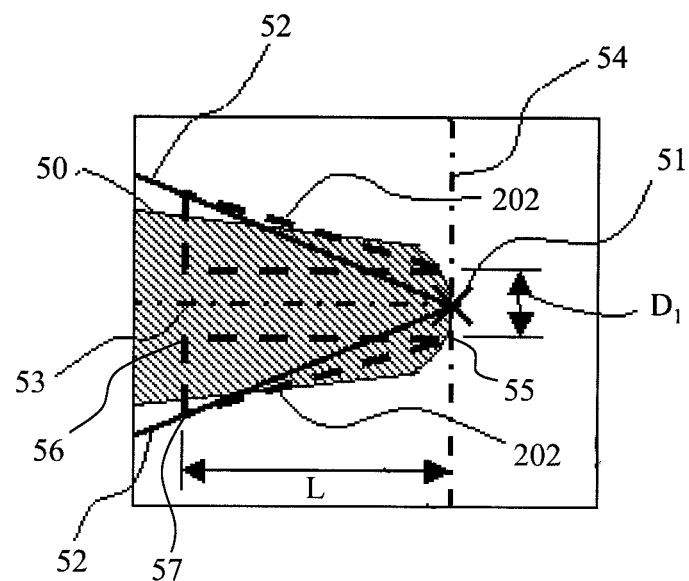
FIG. 9A is an explanatory drawing of a procedure of a second example of the probe automatic processing of the present invention.
Figure 9B:
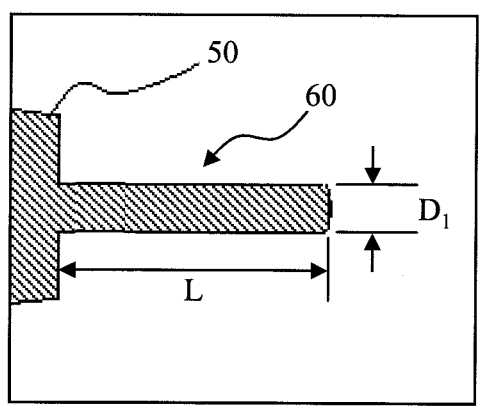
FIG. 9B is an explanatory drawing of a procedure of the second example of the probe automatic processing of the present invention.

With reference to FIG. 9A and FIG. 9B, a second example of the ion-beam processing method according to the present invention is described. In the above-mentioned first example, the processing pattern is a rectangle. In this example, a processing pattern 202 is a triangle. A procedure of obtaining three vertices 55, 56 and 57 of the triangle is described below. The ion beam apparatus used in this example may have the similar configuration to the ion beam apparatus illustrated in FIG. 1.

FIG. 9A illustrates a state where the processing pattern 202 is generated due to the processing pattern generation process 26. In this example, similarly to the description with reference to FIG. 3E, a point with a distance $D_1/2$, which is one half of the width $D_1$ of the probe tip part, from the probe tip 51 is obtained on the vertical line 54, and is set to the first vertex 55. Next, a line which passes through the first vertex 55 and is parallel to the center line 53 is drawn, and a point with a distance which corresponds to the length L of the probe acute part from the probe tip 51 is set to the second vertex 56. A line which passes through the second vertex 56 and is parallel to the vertical line 54 is drawn, and its intersection with the probe contour line 52 is set to the third vertex 57. A diagonal line connecting the third vertex 57 and first vertex 55 is drawn. Thereby, the triangular processing pattern 202 is formed. The inner long side of the triangular representing the processing pattern 202 represents the contour of the probe acute part and is parallel to the probe center line 53. In addition, the processing pattern 202 is configured on each of the both sides of the probe image 50. FIG. 9B illustrates an example of a probe acute part 60 obtained due to the FIB processing. Removal of the region of the processing pattern due to the FIB processing affords the probe acute part having the preset width $D_1$ and length L.

Figure 10A:
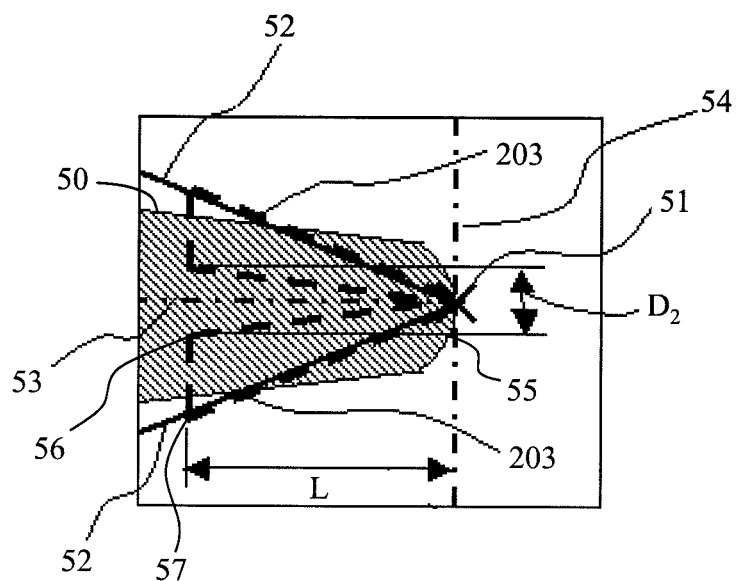
FIG. 10A is an explanatory drawing of a procedure of a third example of the probe automatic processing of the present invention.
Figure 10B:
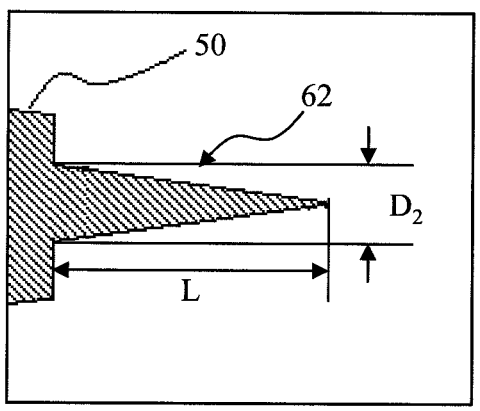
FIG. 10B is an explanatory drawing of a procedure of the third example of the probe automatic processing of the present invention.

With reference to FIG. 10A and FIG. 10B, a third example of the ion-beam processing method according to the present invention is described. In the above-mentioned first and second examples, the preset shape of the probe acute part is the rod-like body with the same width. Moreover, the processing pattern is a rectangle or triangle. In this example, a preset shape of the probe acute part is a needle-like body whose tip is sharp. Moreover, the processing pattern is an oblique triangle. A procedure of obtaining three vertices of the triangle is described below. The ion beam apparatus used in this example may have the similar configuration to the ion beam apparatus illustrated in FIG. 1.

FIG. 10A illustrates a state where a processing pattern 203 is generated due to the processing pattern generation process 26. In this example, the probe tip 51 is set to a first vertex. Next, a point with a distance $D_2/2$, which is one half of the width $D_2$ of the base of the probe tip part, from the probe tip 51 is obtained on the vertical line 54, and is set to an auxiliary point 55. Next, a line which passes through the auxiliary point 55 and is parallel to the center line 53 is drawn, and a point with a distance which corresponds to the length L of the probe acute part from the auxiliary point 55 is set to a second vertex 56. A line which passes through the second vertex 56 and is parallel to the vertical line 54 is drawn, and its intersection with the probe contour line 52 is set to a third vertex 57. A diagonal line connecting the third vertex 57 to the probe tip 51 as the first vertex is drawn. Thereby, the obliquely triangular processing pattern 203 is formed. In addition, the processing pattern 203 is configured on each of the both sides of the probe image 50. The inner oblique sides of the triangles representing the two processing patterns 202 represent the contour of the probe acute part and are in symmetry relative to the probe center line 53. FIG. 10B illustrates an example of a probe acute part 62 obtained due to the FIB processing. Removal of the region of the processing pattern due to the FIB processing affords the needle-like probe acute part having the preset base width $D_2$ and length L.

Figure 11A:
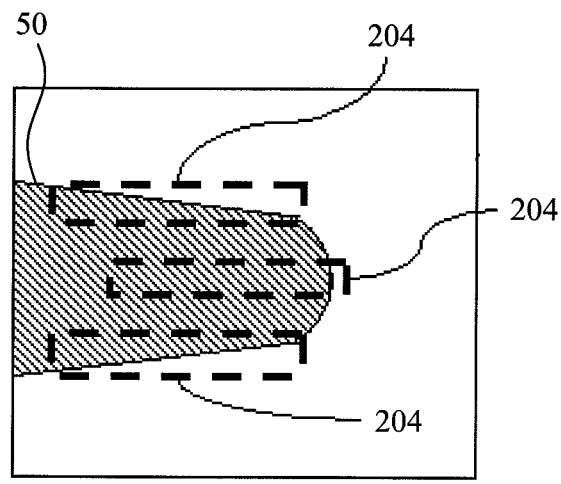
FIG. 11A is an explanatory drawing of a procedure of a fourth example of the probe automatic processing of the present invention.
Figure 11B:
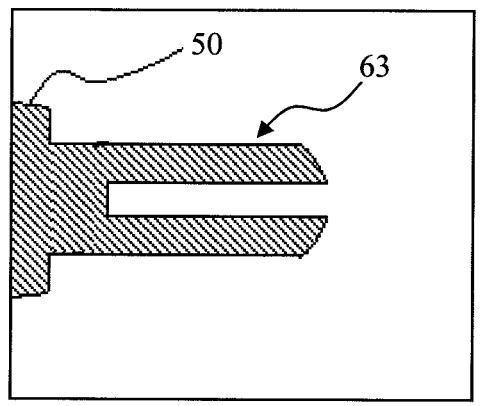
FIG. 11B is an explanatory drawing of a procedure of the fourth example of the probe automatic processing of the present invention.

With reference to FIG. 11A and FIG. 11B, a fourth example of the ion-beam processing method according to the present invention. In the above-mentioned examples, the preset shape of the probe acute part is a rod-like body or needle-like body having a single tip. In this example, the shape of the probe acute part is a two-forked structure having two tips as illustrated in FIG. 11B. In this case, it can be considered that three processing patterns 204 are configured as illustrated in FIG. 11A. Coordinates of individual points of the contour and the tip of the probe image have been obtained. Accordingly, by configuring shapes and positions of the processing patterns on the coordinates of the probe image, the FIB processing can be performed automatically. The processing patterns have symmetric shapes relative to the probe center line and are arranged at symmetric positions. Accordingly, the processing can be performed automatically due to the ion-beam processing method illustrated in FIG. 2 and FIG. 8. According to the fourth example of the ion-beam processing method according to the present invention, there is an effect due to which a shape of a tip of a probe can undergo processing into an arbitrary shape since arbitrary processing patterns can be created.

Figure 12A:
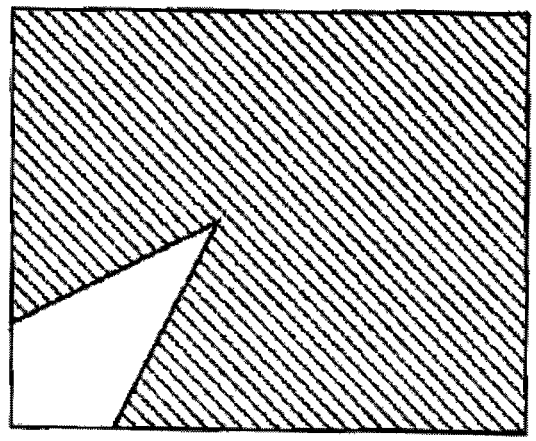
FIG. 12A is an explanatory drawing of a procedure of obtaining probe tip coordinates in the probe automatic processing of the present invention.
Figure 12B:
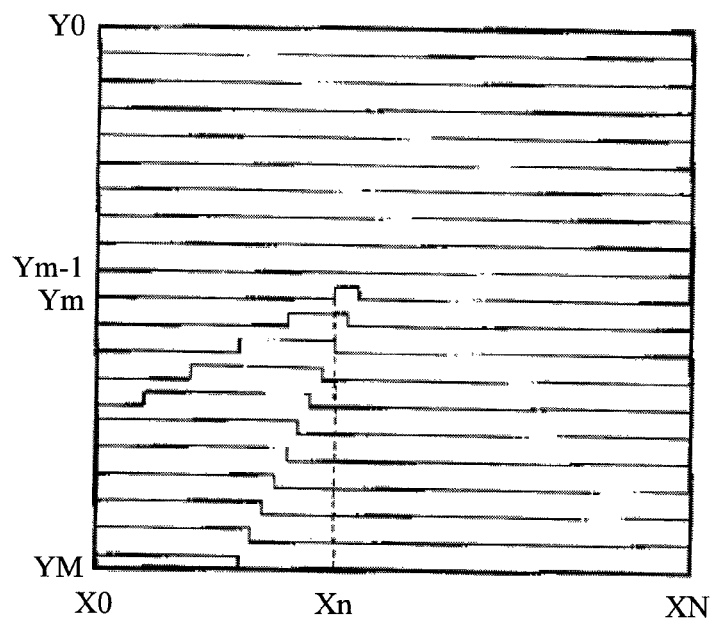
FIG. 12B is an explanatory drawing of a procedure of obtaining probe tip coordinates in the probe automatic processing of the present invention.
Figure 12C:
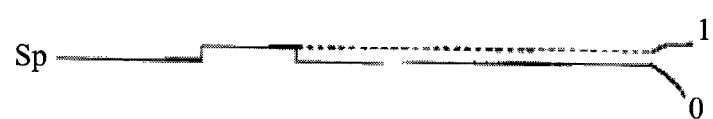
FIG. 12C is an explanatory drawing of a procedure of obtaining probe tip coordinates in the probe automatic processing of the present invention.

With reference to FIG. 12A, FIG. 12B and FIG. 12C, an example of a method of detecting the probe tip is described. FIG. 12A illustrates a probe image displayed based on a binarized (set to 0 or 1) image signal Sp. A white portion represents the probe image and the image signal Sp=1, and a dark portion represents other than the probe image and the image signal Sp=0.

FIG. 12B is a diagram schematically illustrating content of the memory in which the image in FIG. 12A is stored. This image is constituted of N×M pixels. The coordinates of the pixel are represented by (Xi, Yj) (i and j are integers), where i=0 to N and j=0 to M. N denotes the digital partition number of the field of vision in the X direction, and M denotes the digital partition number of the field of vision in the Y direction.

FIG. 12C schematically illustrates a result of read-out of the image signal Sp along the X direction for a given Y. At the high level, Sp=1, and at the low level, Sp=0. For example, while Y=Y0 to Ym−1, the image signal Sp=0 for all X. While Y=Ym to YM, the image signal Sp=1 in a given range of X. Based on this information, the probe tip can be detected. For example, it may be determined that the tip is a place at which an X distance between a rising edge (0 to 1) and falling edge (1 to 0) for the image signals Sp read out from individual lines in the range of Y=Y0 to Ym is smallest. In the example illustrated in the figure, it is decided that coordinates (Xn, Ym) are the probe tip coordinates.

Figure 13A:
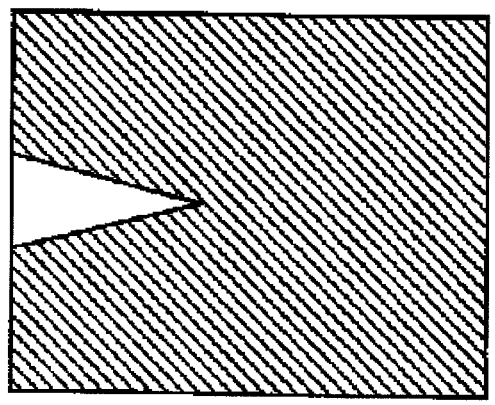
FIG. 13A is an explanatory drawing of a procedure of obtaining probe tip coordinates in the probe automatic processing of the present invention.
Figure 13B:
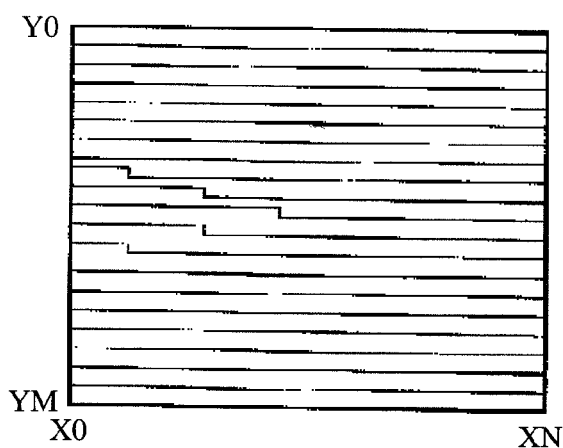
FIG. 13B is an explanatory drawing of a procedure of obtaining probe tip coordinates in the probe automatic processing of the present invention.
Figure 13C:
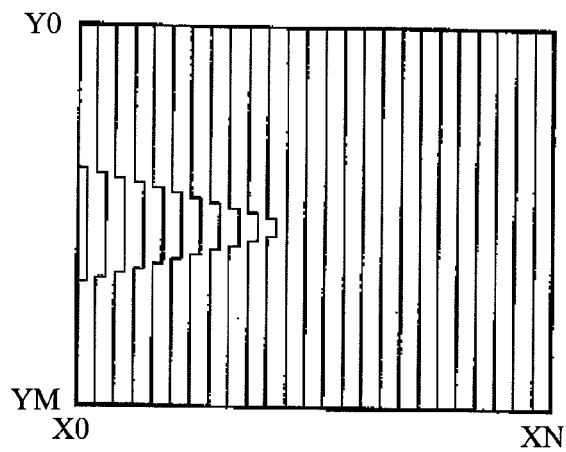
FIG. 13C is an explanatory drawing of a procedure of obtaining probe tip coordinates in the probe automatic processing of the present invention.
Figure 13D:
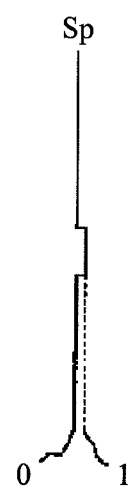
FIG. 13D is an explanatory drawing of a procedure of obtaining probe tip coordinates in the probe automatic processing of the present invention.

In case of the probe image at the transverse position as illustrated in FIG. 13A, the above-mentioned method cannot be used for the detection of the probe tip. FIG. 13B schematically illustrates content of the memory in which the image in FIG. 13A is stored. In this case, read-out of the image signals Sp along the X direction for individual Y can lead to the detection of the rising edges (0 to 1) but cannot lead to the detection of the falling edges (1 to 0). Therefore, it can be considered that the image signals Sp are read out in the Y direction for individual X values as illustrated in FIG. 13C and FIG. 13D. Picking out a place at which a Y distance between a rising edge and falling edge is smallest affords coordinates as the probe tip coordinates.

In the probe tip position identification method of this example, the probe image is generated based on the detection signal of the probe incoming current. Accordingly, it is not the case that the image signal Sp=1 in the region other than the probe. Therefore, the probe image can be obtained in high accuracy. Accordingly, the probe image can be obtained in high accuracy compared with the case where the probe image is obtained due to image pattern recognition from the SIM image.

In this example, by binarizing the image signal Sp, the noise can be removed. However, in the case that a significant point of Sp=1 exists in the region other than the probe image and that the tip position cannot be detected using the above-mentioned method, the significant point can be removed by averaging each pixel and its peripheral pixels for all the pixels in the memory and performing smoothing.

In the above-mentioned examples, use of an incoming current image of the probe as the probe image 50 is described for generating the processing pattern. However, a scanning ion microscopy image (SIM image) may be used instead of the incoming current image of the probe.

As above, examples of the present invention are described, whereas the present invention is not limited to the above-mentioned examples, but it should be understood by the skilled in the art that various modifications may occur within the scope of the appended claims which claim the present invention.

REFERENCE SIGNS LIST

1: ion beam optical system, 2: substrate, 3: sample stage, 4: probe, 5: probe driving unit, 6: probe current detection unit, 7: deposition gas source, 8: secondary electron detector, 9: ion beam, 10: display unit, 11: central processing unit, 12: deflector, 13: input unit, 21: probe shape generation process, 22: probe image storing process, 23: probe tip coordinate extraction process, 24: probe contour line extraction process, 25: probe center line extraction process, 26: processing pattern generation process, 50: probe image, 51: probe tip, 52: probe contour line, 53: probe center line, 54: probe vertical line, 55, 56, 57 and 58: points, 60, 61 and 62: probe acute parts, 201, 202, 203 and 204: processing patterns

The invention claimed is:

1. An ion beam apparatus comprising:
an ion beam optical system irradiating a sample with an ion beam;
a probe capable of touching the sample, wherein the probe is provided to deliver a fine piece of the sample;
a probe driving unit driving the probe;
a probe current detection unit detecting incoming current into the probe; and
a central processing unit controlling the ion beam optical system and the probe in order to create a fine sample from the sample, wherein the central processing unit is configured to perform:
a probe shape generation process of detecting a probe shape based on the probe incoming current detected by the probe current detection unit to obtain a probe image,
a probe tip coordinate extraction process of detecting a tip position of the probe from the probe shape,
a probe contour line extraction process of generating a probe contour line obtained by approximating a contour of the probe from the tip position of the probe and the probe shape,
a processing pattern generation process of generating a processing pattern based on the probe tip position and a preset shape and dimension of a probe acute part,
an ion-beam irradiation process of performing irradiation with an ion beam based on the processing pattern and removing a robe within a region of the processing pattern;
an ion beam termination process of performing, based on the processing pattern, termination of ion-beam processing, and
a processing pattern generation rerun process of rotating the probe after removing, by the ion-beam processing, a processing pattern region which is provided on both sides of the probe image obtained by the probe shape generation process, to rerun the processes from the probe shape generation process to the ion beam termination process, thereby performing a probe restoration process.

2. The ion beam apparatus according to claim 1, wherein in the ion beam termination process, the ion-beam irradiation is terminated upon elapse of a preset ion-beam irradiation time from initiation of the ion-beam irradiation.

3. The ion beam apparatus according to claim 1, wherein in the ion beam termination process, a probe image in processing is monitored, the probe image is compared with the processing pattern, and the ion-beam irradiation is terminated when a difference between the processing pattern and the contour of the probe image is smaller than a predetermined value.

4. The ion beam apparatus according to claim 1, wherein in the ion beam termination process, a probe image in processing is monitored, when the probe image is changed, the processing pattern is changed accordingly, and when a width of the processing pattern becomes smaller than a predetermined value, the ion-beam irradiation is terminated.

5. The ion beam apparatus according to claim 1, wherein the central processing unit is further configured to perform a probe center line extraction process of generating a center line and a vertical line of the probe from the probe contour line, the vertical line perpendicular to the center line, and
in the probe contour line extraction process, a straight line passing through the tip position of the probe is configured, and the probe contour line is generated by calculating an inclination of the straight line using a least square method.

6. The ion beam apparatus according to claim 1, wherein in the probe shape generation process, a binarized image signal is generated based on the probe incoming current, and the probe shape is detected from the binarized image signal.

7. An ion-beam processing method comprising:
a probe shape generation step of generating a shape of a probe disposed over an upper side of a sample to obtain a probe image, wherein the probe is provided to deliver a fine piece of the sample;
a probe tip position detection step of detecting a position of a probe tip from the probe shape;
a probe contour line extraction step of generating a probe contour line which is obtained by approximating a contour of the probe from the shape of the probe and the position of the probe tip and which passes through the probe tip;
a processing pattern generation step of generating a processing pattern based on the probe tip position and a preset shape and dimension of a probe acute part;
an ion-beam irradiation step of performing irradiation with an ion beam based on the processing pattern and removing a probe within a region of the processing pattern;
an ion beam termination step of terminating the irradiation with the ion beam; and
a processing pattern generation rerun step of rotating the probe after removing, by the ion-beam irradiation, a processing pattern region which is provided on both sides of the probe image obtained by the probe shape generation process, to rerun the processes from the probe shape generation process to the ion beam termination process, thereby performing a probe restoration process.

8. The ion-beam processing method according to claim 7, wherein
in the probe shape generation step, a binarized image signal is generated based on incoming current of the probe, and the probe shape is detected from the binarized image signal.

9. The ion-beam processing method according to claim 7, wherein
in the probe shape generation step, the probe shape is detected from a scanning ion microscopy image (SIM image).

10. The ion-beam processing method according to claim 7, wherein
in the ion beam termination step, the ion-beam irradiation is terminated upon elapse of a preset ion-beam irradiation time from initiation of the ion-beam irradiation.

11. The ion-beam processing method according to claim 7, wherein
in the ion beam termination step, a probe image in processing is monitored, the probe image is compared with the processing pattern, and the ion-beam irradiation is terminated when a difference between the processing pattern and the contour of the probe image is smaller than a predetermined value.

12. The ion-beam processing method according to claim 7, wherein in the ion beam termination step, a probe image in processing is monitored, when the probe image is changed, the processing pattern is changed accordingly, and when a width of the processing pattern becomes smaller than a predetermined value, the ion-beam irradiation is terminated.

* * * * *